United States Patent
Shih et al.

(10) Patent No.: US 8,139,687 B2
(45) Date of Patent: Mar. 20, 2012

(54) METHOD TO TRACK A TARGET FREQUENCY OF AN INPUT SIGNAL

(75) Inventors: Pei-Jun Shih, Sinshih Township, Tainan County (TW); Tien-Ju Tsai, Sinshih Township, Tainan County (TW); Jeng-Shiann Jiang, Sinshih Township, Tainan County (TW)

(73) Assignee: Himax Media Solutions, Inc., Tainan County (TW)

( * ) Notice: Subject to any disclaimer, the term of this patent is extended or adjusted under 35 U.S.C. 154(b) by 775 days.

(21) Appl. No.: 12/264,985

(22) Filed: Nov. 5, 2008

(65) Prior Publication Data

US 2010/0111240 A1    May 6, 2010

(51) Int. Cl.
*H04L 27/00* (2006.01)
*H04L 27/22* (2006.01)
*H03D 3/24* (2006.01)

(52) U.S. Cl. ......... 375/326; 375/327; 375/344; 329/307
(58) Field of Classification Search ................. 375/326, 375/322, 324, 327, 344, 376; 348/726; 329/304, 329/306, 307; 455/255, 257, 258, 259, 260, 455/265
See application file for complete search history.

(56) References Cited

U.S. PATENT DOCUMENTS

| | | | |
|---|---|---|---|
| 6,133,964 A | * | 10/2000 | Han ............................ 348/726 |
| 2005/0135508 A1 | * | 6/2005 | Kim et al. ..................... 375/326 |

* cited by examiner

*Primary Examiner* — Betsy Deppe
(74) *Attorney, Agent, or Firm* — Thomas, Kayden, Horstemeyer & Risley, LLP

(57) ABSTRACT

A digital demodulator adapted in a receiver and a digital demodulation method are provided. The digital demodulator includes: a phase splitter, a complex multiplier, an AFC, a limiter, a phase detector, a re-tracker, a post-multiplier and an oscillator. The phase splitter generates a complex signal from the input signal. The complex multiplier multiplies the complex signal by both first and second phase signals to generate first and second base band signals. The AFC generates a first output signal. The limiter generates a trend signal and the re-tracker generates a tuning signal from the first output signal. The phase detector multiplies the trend and second base signal and adjusts the multiplied signal based on the tuning signal. The oscillator generates the first and second phase signals according to the output of the phase detector. The post-multiplier multiplies the trend signal by the first and second base band signals for output.

20 Claims, 6 Drawing Sheets

METHOD TO TRACK A TARGET FREQUENCY OF AN INPUT SIGNAL

BACKGROUND

1. Field of Invention

The present invention relates to a digital demodulator. More particularly, the present invention relates to a digital demodulator and a digital demodulation method.

2. Description of Related Art

The television signal transmission system is widely used today. The conventional receiver of the television signal transmission system comprises a digital demodulator that acts as a frequency phase locked loop (FPLL) to lock the frequency of the input signal. In recent years, digital frequency phase locked loop (DFPLL) is used to replace the FPLL. However, it's hard to detect the proper timing to enlarge or narrow the phase-locked loop bandwidth to lock the frequency of the input signal. If the tuning is not performed on the right time, the performance of the demodulation system will dramatically drop off. Also, a reset step is needed, if the input signal may still fail to be locked in a long time.

Accordingly, how to detect the proper timing for tuning the phase-locked loop bandwidth is the key for a digital demodulator and a digital demodulation method to overcome the above issues. The present invention addresses such a need.

SUMMARY

A digital demodulator adapted in a receiver is provided. The digital demodulator receives an input signal. The digital demodulator comprises: a phase splitter, a complex multiplier, an automatic frequency control (AFC), a limiter, a phase detector, a re-tracker, a post-multiplier and an oscillator. The phase splitter generates a complex signal according to the input signal. The complex multiplier multiplies the complex signal by both first and second phase signals to generate first and second base band signals. The AFC receives the first base band signal to generate a first output signal. The limiter generates a trend signal according to the first output signal. The re-tracker generates a tuning signal according to the first output signal. The phase detector multiplies the trend signal and the second base band signal and adjusts the multiplied signal based on the tuning signal. Wherein the phase detector further comprises a multiplier for multiplying the trend signal by the second base band signal and an automatic phase controller (APC) for receiving the multiplied signal and adjusting the phase of the multiplied signal by changing at least one bandwidth parameter of the automatic phase controller according to the tuning signal. The oscillator generates the first and the second phase signals according to the output of the phase detector. The post-multiplier multiplies the trend signal by the first and second base band signals for output.

Another object of the present invention is to provide a digital demodulation method adapted in a digital demodulator to adjust the phase-locked loop bandwidth comprising the steps of: generating a complex signal according to the input signal; multiplying the complex signal by first and second phase signals having a predetermined frequency to generate first and second base band signals respectively; generating a first output signal according to the first base band signal; generating a trend signal according to the first output signal; trend signal by the second base band signal to generate a multiplied signal; generating a tuning signal; receiving the multiplied signal and tuning the phase of the multiplied signal by changing at least one bandwidth parameter of the digital demodulator according to the tuning signal to generate a second output signal; generating the first and the second phase signals according to the second output signal; and multiplying the trend signal by the first and second base band signals for output.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
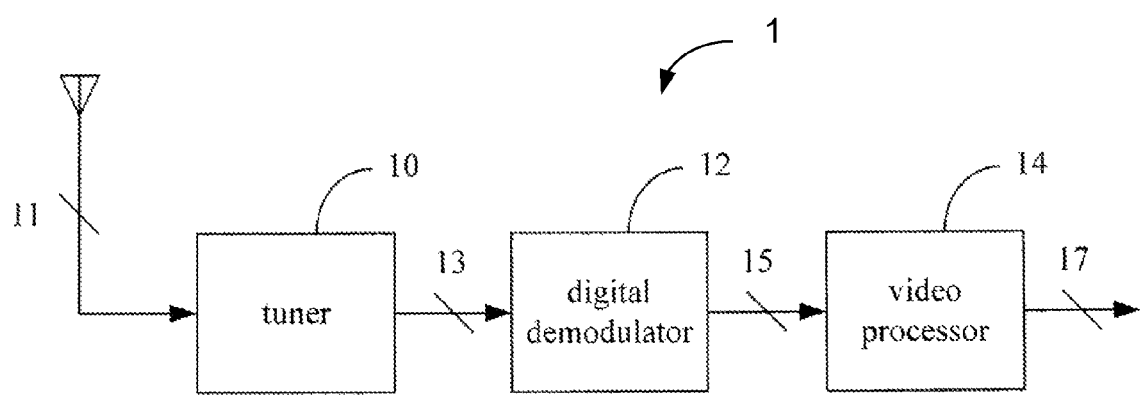
FIG. 1 is a block diagram of a receiver.

Reference will now be made in detail to the present embodiments of the invention, examples of which are illustrated in the accompanying drawings. Wherever possible, the same reference numbers are used in the drawings and the description to refer to the same or like parts.

FIG. 1 is a block diagram of a receiver 1. The receiver 1 comprises a tuner 10, a digital demodulator 12 and a video processor 14. The tuner 10 receives a radio frequency (RF) signal 11 from an antenna. The tuner 10 further converts the RF signal 11 into an intermediate frequency (IF) signal, band-passes the IF signal and controls the amplitude of the IF signal. After an analog-to-digital conversion, the analog IF signal turns into a digital signal 13. The digital demodulator 12 receives the digital signal 13 and provides a frequency tracking mechanism to lock the frequency of the digital signal 13 to remove frequency and phase errors of the received signal. After locking the frequency of the digital signal 13, a baseband signal 15 is generated. The video processor 14 further performs, for example, equalization, decoding, de-interleaving and de-randomizing to produce a video signal 17 to a display panel (not shown).

Figure 2:
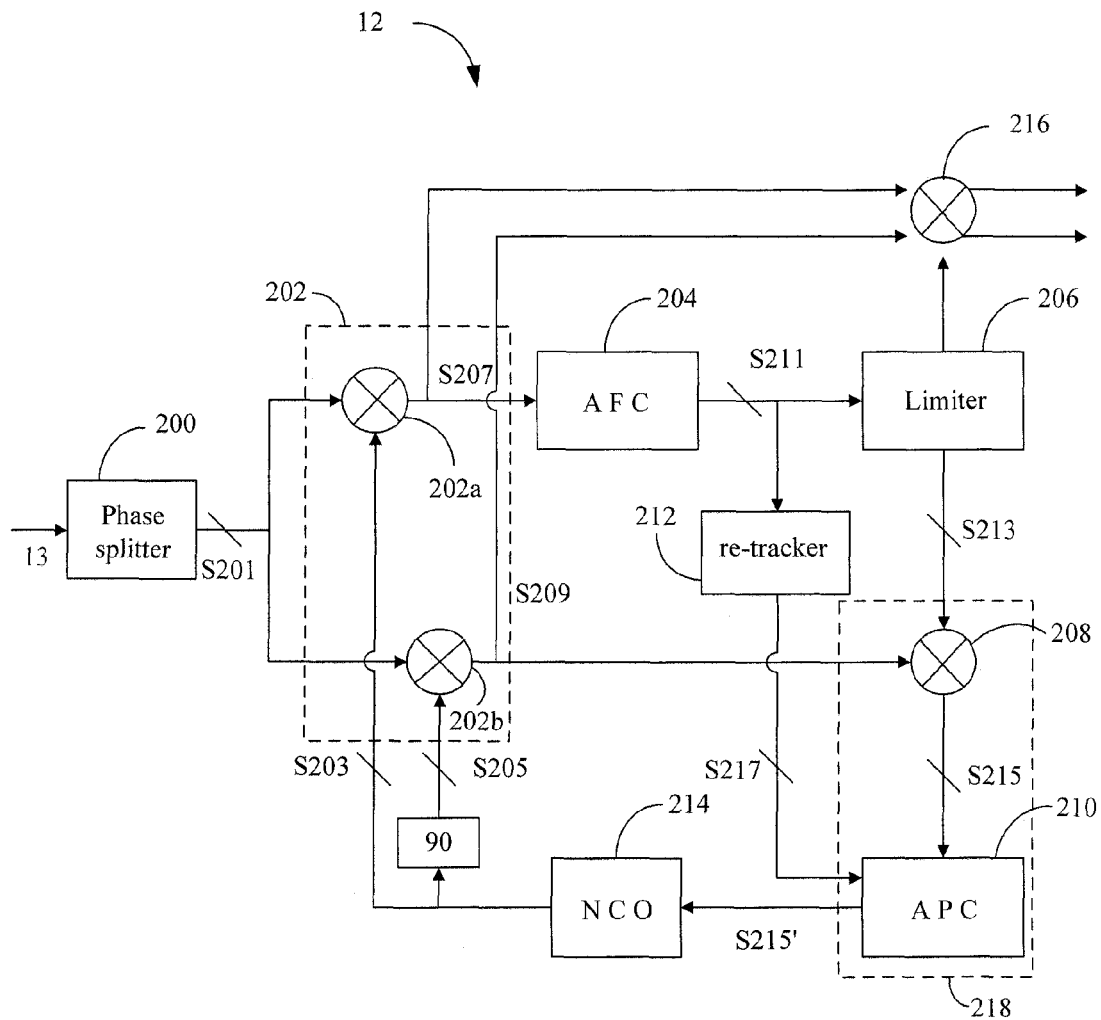
FIG. 2 is a block diagram of a digital demodulator of the first embodiment of the present invention.

FIG. 2 is a block diagram of the digital demodulator 12 in FIG. 1 of the first embodiment of the present invention. The digital demodulator 12 comprises a phase splitter 200, a complex multiplier 202, an automatic frequency controller (AFC) 204, a limiter 206, a phase detector 218, a re-tracker 212 and an oscillator 214. The phase splitter 200 receives the digital signal 13 described above. The phase splitter 200 further splits the input signal into real number and imaginary number components to generate a complex signal S201. The complex multiplier 202 substantially comprises a real multiplier 202a and an imaginary multiplier 202b and multiplies the complex signal S201 by both first and second phase signals S203, S205 to generate first and second base band signals S207, S209 respectively. The phase difference between the first and second phase signals S203, S205 is 90 degrees. The first base band signal S207 corresponds to the real component of the multiplied complex signal and the second base band signal S209 corresponds to the imaginary component of the multiplied complex signal.

The AFC 204 receives the first base band signal S207 and generates an output signal S211. The smaller a frequency offset between an output of an internally-installed voltage controlled oscillator (not shown) and the first base band signal S207, the larger the absolute value of the output signal S211 is. On the contrary, the larger a frequency offset, the smaller the absolute value of the output signal S211 is. The value of the output signal S211 may be positive value, if the frequency of the internally-installed voltage controlled oscillator is higher than the frequency of the first base band signal S207. On the contrary, the value of the output signal S211 may be negative value. The limiter 206 further generates a trend signal S213 according to the output signal S211. When the output signal S211 is positive, the trend signal S213 is a value +1, and when the output signal S211 is negative or equal to 0, the trend signal S213 is a value −1. The phase detector 218 comprises a multiplier 208 and an automatic phase controller (APC) 210. The multiplier 208 multiplies the trend signal S213 by the second base band signal S209. The APC 210 receives the multiplied output S215 of the multiplier 208 and further a tuning signal 217 generated by the re-tracker 212, which will be described below, and adjusts at least one phase-locked loop bandwidth parameter (Loop Gain, Ki, Kp) of the APC 210 accordingly. The re-tracker 212 detects the output signal S211 of the AFC 204 and compares the output signal S211 with a plurality of threshold values to generate the tuning signal S217, wherein, the threshold values may be computed according to the input signal 13. For example, those threshold values may be generated based on the average of the absolute peak value of the amplitude of the input signal 13 in the present time period. Alternately, the re-tracker 212 may detect the average output signal S211 in a predetermined period time and compares the average output signal S211 with a plurality of threshold values to generate the tuning signal S217. After adjusting at least one of the phase-locked loop bandwidth parameters, the APC 210 generates an output signal S215' to the oscillator 214. The oscillator 214 is a numerically controlled oscillator (NCO) to generate the first and the second phase signals S203, S205 according to the output signal S215' of APC 210. Once the frequency of the complex signal S201 is locked, the first and second base band signals S207, S209 are outputted to the video processor 14 through a post-multiplier 216. The post-multiplier multiplies the trend signal S213 by the first and second base band signals S207, S209 respectively.

Figure 3:
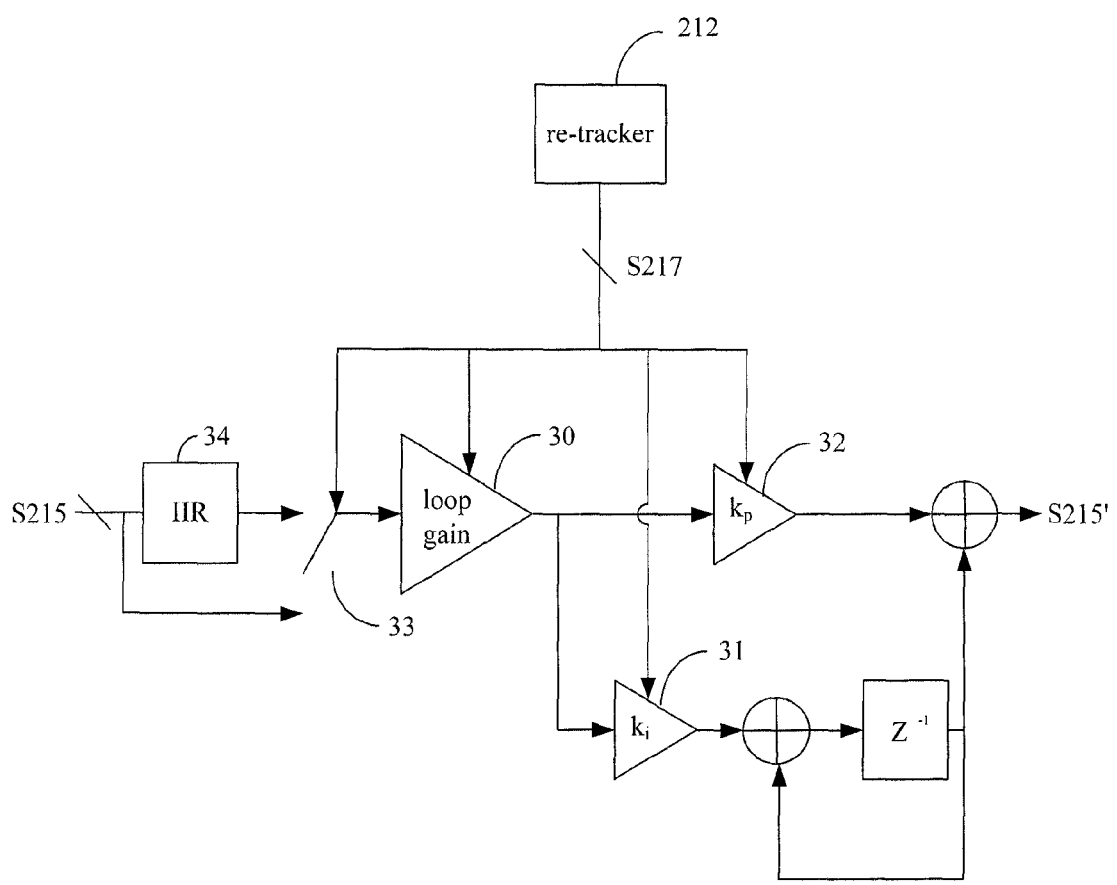
FIG. 3 is a block diagram of an automatic phase controller (APC) of the first embodiment of the present invention.

FIG. 3 further shows a block diagram of the APC 210 in FIG. 2 of the first embodiment of the present invention. The APC 210 mainly comprises an amplifier 30 with a loop gain, two bandwidth parameter controllers 31 (Ki) and 32 (Kp). In other embodiment, a different APC from the above can be used. The tuning signal S217 generated by the re-tracker 212 substantially controls the amplifier 30, two bandwidth parameter controllers 31 and 32 to adjust the phase-locked loop bandwidth. The APC 210 further comprises a switch 33 and a low pass filter 34. The switch 33 is open when tuning the bandwidth parameter and coupled to the multiplied signal S215 directly when the tuning is done. Moreover, the switch 33 is coupled to the multiplied signal S215 through the low pass filter 34 to generate the noiseless output signal S215' only when the complex signal S201 is locked.

Figure 4:
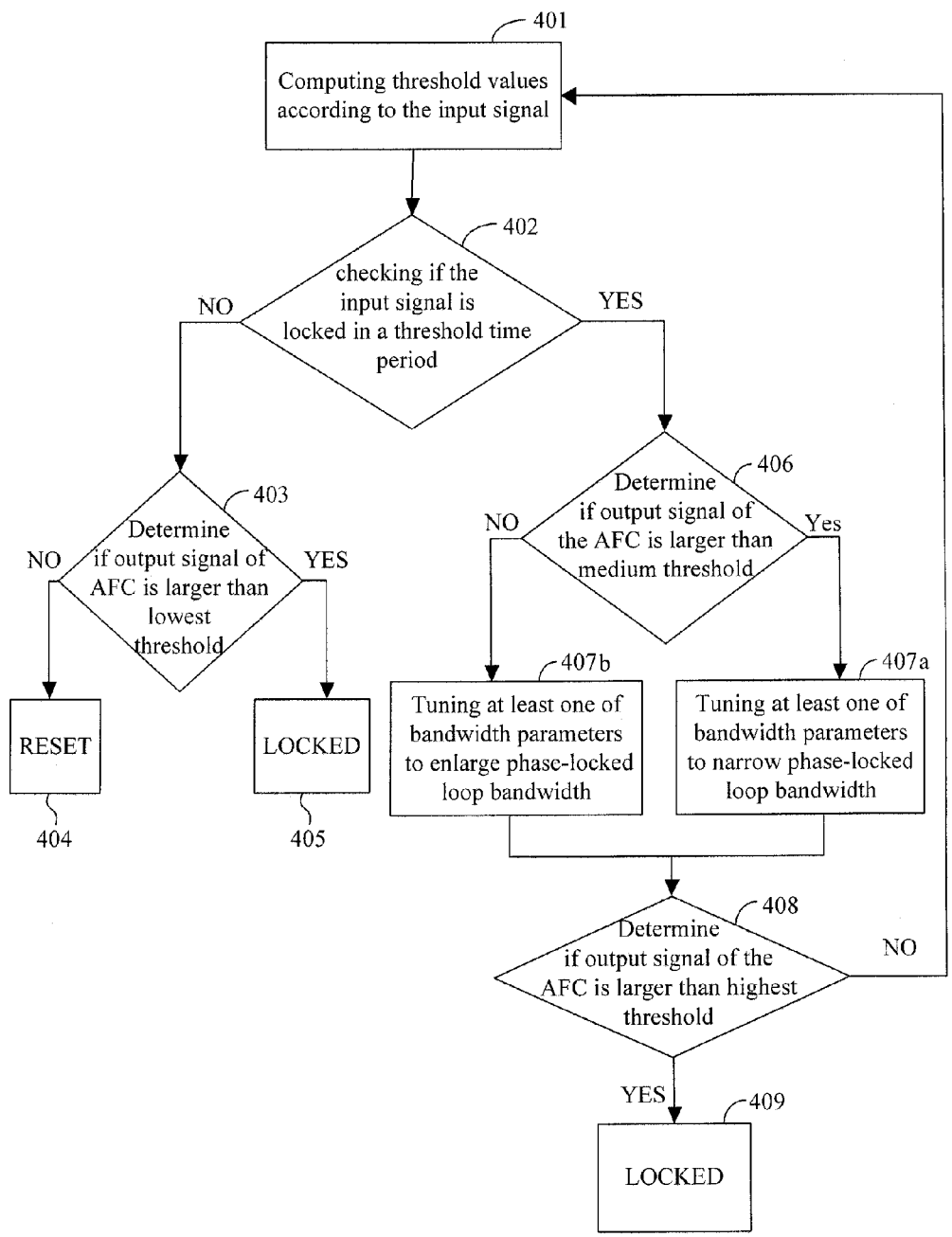
FIG. 4 is a flow chart depicting how the re-tracker in FIG. 2 works to generate a tuning signal, when the input signal is not locked, in an embodiment of the present invention.

In order to explain the frequency locking mechanism that the re-tracker 212 provides, please refer to FIG. 4, which is a flow chart depicting how the re-tracker 212 in FIG. 2 works to generate the tuning signal S217, when the input signal is not locked, in an embodiment of the present invention. In step 401, the re-tracker 212 computes a plurality of threshold values according to the average of the input signal 13. For example, a lowest threshold thr_L, a medium threshold thr_M and a highest threshold thr_H are calculated according to the present average. The equation can be expressed as:

$Thr\_L = A*(present\_avg)$ $Thr\_M = B*(present\_avg)$ $Thr\_H = C*(present\_avg)$ Wherein A, B and C are properly selected constants and A<B<C.

The threshold values are used to determine different convergence conditions of the phase-locked loop bandwidth. The absolute value of the output signal S211 of the AFC 204 becomes a larger value if the frequency offset is near 0.

In step 402, the complex signal S201 is checked to determine if it is locked in a threshold time period. If the complex signal S201 is not locked in a threshold time period, the output signal S211 is compared with the lowest threshold value Thr_L in step 403. If the output signal S211 is smaller than the lowest threshold value Thr_L, the re-tracker 212 resets the digital demodulator 12 in step 404. If the output signal S211 is larger than the lowest threshold Thr_L, the re-tracker 212 determines that though the digital demodulator 12 suffers the noise, the complex signal S201 can still be acceptable and locked in step 405.

Otherwise, a comparison is made to determine if the output signal S211 is larger than the medium threshold Thr_M in step 406. The tuning signal S217 generated by the re-tracker 212 tunes at least one of the bandwidth parameters to narrow the phase-locked loop bandwidth, not below a lowest bandwidth threshold, to approach the frequency of the complex signal S201 in step 407a, if the output signal S211 is larger than the medium threshold Thr_M. The tuning signal S217 generated by the re-tracker 212 tunes at least one of the bandwidth parameters to enlarge the phase-locked loop bandwidth, not exceeding a highest bandwidth threshold, to capture the frequency of the complex signal S201 in step 407b, if the output signal S211 is smaller than the medium threshold Thr_M. Further, in order to prevent the phase-locked loop bandwidth from being too large/small, the highest bandwidth threshold and the lowest bandwidth threshold are set. A comparison is made to determine if the output signal S211 is larger than the highest threshold Thr_H in step 408. The re-tracker 212 determines that the complex signal S201 is locked in step 409, if the output signal S211 is larger than the highest threshold Thr_H, or backs to step 401 if the output signal S211 is not larger than the highest threshold Thr_H.

Figure 5:
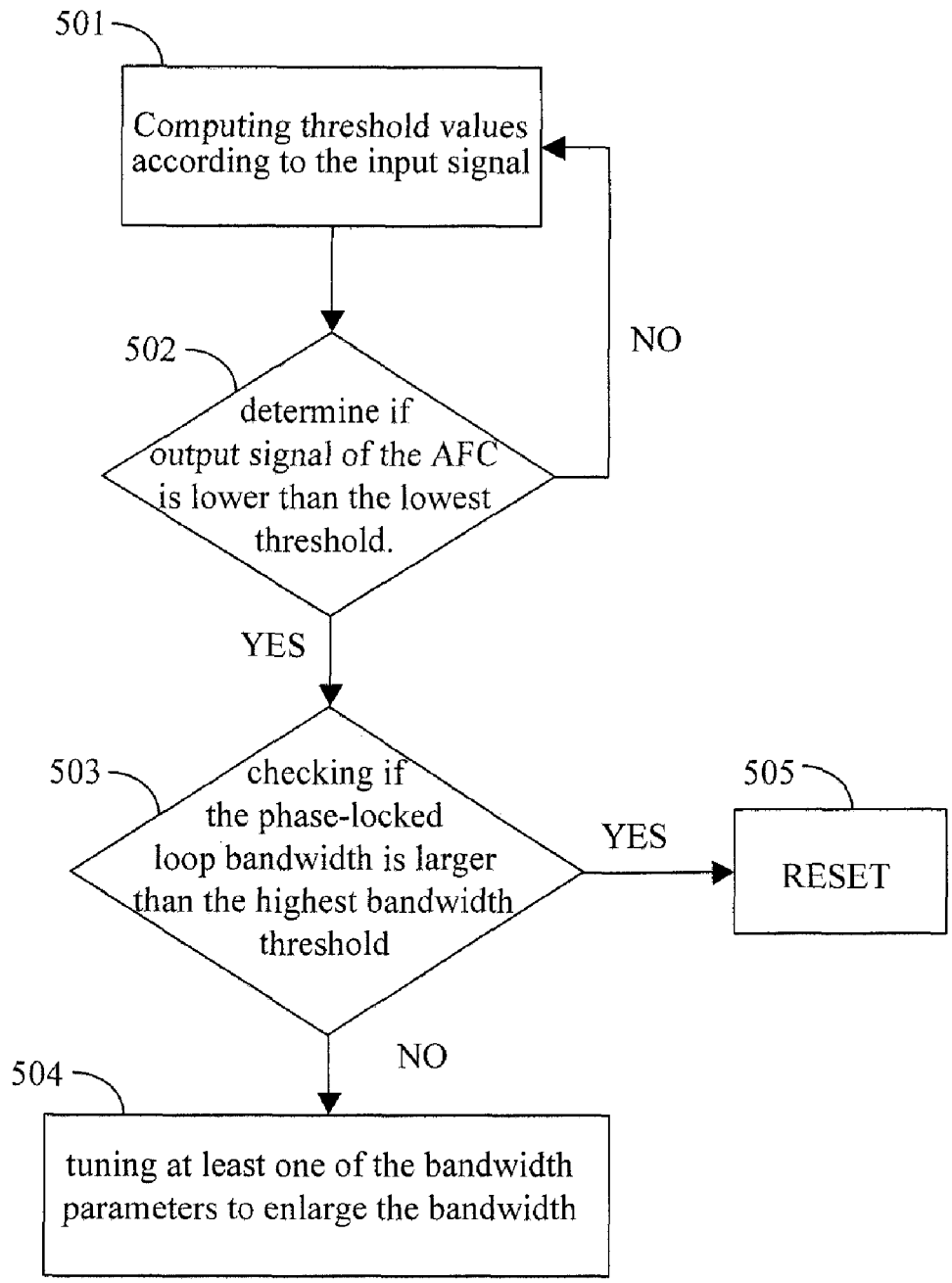
FIG. 5 is a flow chart depicting how the re-tracker in FIG. 2 works to generate a tuning signal, when the input signal suffers noise after locked, in an embodiment of the present invention.

FIG. 5 is a flow chart depicting how the re-tracker 212 works to generate the tuning signal S217 under the condition when the digital demodulator 12 locks the complex signal S201. If a noise suddenly occurs in the receiver 1, the input signal may suffer the noise, and the locking mechanism may fail to lock the complex signal S201 that is locked previously. Thus, the re-tracker 212 has to generate the tuning signal S217 to re-lock the complex signal S201 as soon as possible. In step 501, a plurality of threshold values are calculated as in step 401 previously described. Then in step 502, a comparison is made to determine if the output signal S211 is smaller than the lowest threshold Thr_L. If the output signal S211 is smaller than the lowest threshold Thr_L, the phase-locked loop bandwidth is checked to determine if the phase-locked loop bandwidth is larger than the highest bandwidth threshold in step 503. Otherwise, the following step goes to step 501. If the phase-locked loop bandwidth is smaller than the highest bandwidth threshold, the tuning signal S217 is generated to tune at least one of the bandwidth parameters to enlarge the phase-locked loop bandwidth in step 504. Otherwise, the re-tracker 212 resets the digital demodulator 12.

Figure 6:
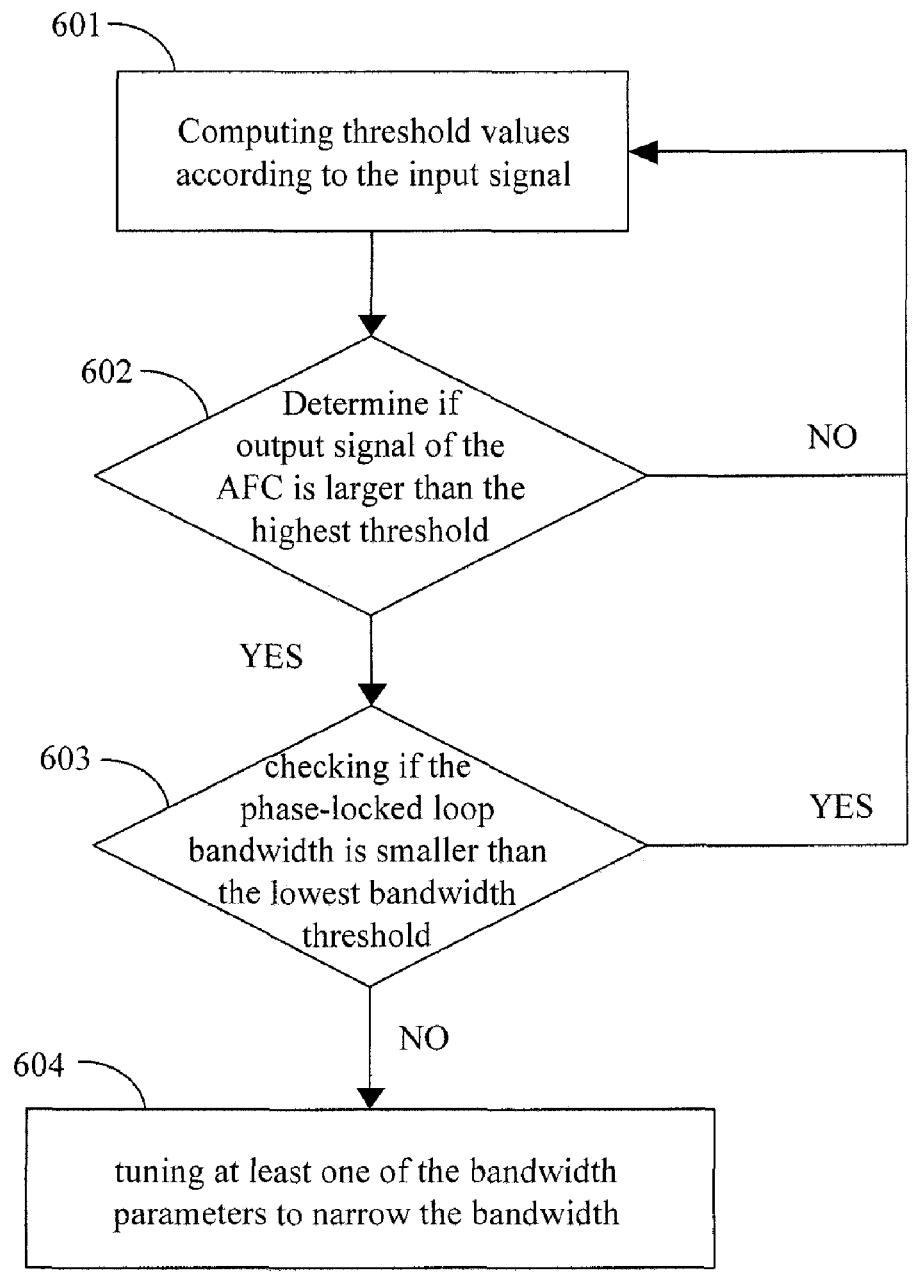
FIG. 6 is a flow chart depicting how the re-tracker in FIG. 2 works to generate a tuning signal, when the input signal stays good after locked, in an embodiment of the present invention.

FIG. 6 is also a flow chart depicting how the re-tracker 212 works to generate the tuning signal S217 under the condition when the digital demodulator 12 locks the complex signal S201. At first, the step 601 is still the same as the step 501. In step 602, a comparison is made to determine if the output signal S211 is larger than the highest threshold Thr_H. If the output signal S211 is larger than the highest threshold Thr_H, the phase-locked loop bandwidth is checked to determine if the phase-locked loop bandwidth is smaller than the lowest bandwidth threshold in step 603. Otherwise, the following step goes to the step 601. If the phase-locked loop bandwidth is larger than the lowest bandwidth threshold, the tuning signal S217 is generated to narrow the phase-locked loop bandwidth in step 604. Otherwise, then the re-tracker 212 does nothing and the following step goes to the step 601.

The digital demodulator and the digital demodulation method provided in the present invention can remove the frequency and phase offset in a real-time manner to lock the complex signal S201. If there is too much noise to lock the complex signal S201, the re-tracker will reset the digital demodulator to start a new locking process to re-lock the complex signal S201 as soon as possible.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A digital demodulator adapted in a receiver, wherein the digital demodulator receives an input signal, the digital demodulator comprises:
    a phase splitter to generate a complex signal according to the input signal;
    a complex multiplier to multiply the complex signal by both first and second phase signals to generate first and second base band signals, respectively;
    an automatic frequency controller to receive the first base band signal to generate a first output signal;
    a limiter to generate a trend signal according to the first output signal;
    a re-tracker to generate a tuning signal according to the first output signal;
    a phase detector to multiply the trend signal and the second base signal and to adjust the multiplied signal based on the tuning signal;
    an oscillator to generate the first and the second phase signals according to the output of the phase detector; and
    a post-multiplier to multiply the trend signal by the first and second base band signals for output.

2. The digital demodulator of claim 1, wherein the phase difference between the first and second phase signals is 90 degrees.

3. The digital demodulator of claim 1, wherein the first base band signal is the real component of the output of the complex multiplier and the second base band signal is the imaginary component of the output of the complex multiplier.

4. The digital demodulator of claim 1, wherein the phase detector further comprises:
    a multiplier to multiply the trend signal by the second base band signal; and
    an automatic phase controller to receive the multiplied signal and adjust the phase of the multiplied signal by changing at least one bandwidth parameter of the automatic phase controller according to the tuning signal.

5. The digital demodulator of claim 4, wherein the automatic phase controller comprises an amplifier and a pair of bandwidth parameter controllers, and the at least one bandwidth parameter is the gain of the amplifier or the bandwidth parameter controllers.

6. The digital demodulator of claim 4, wherein the re-tracker generates the tuning signal based on a plurality of threshold values, wherein the threshold values are obtained according to average of the absolute peak value of the amplitude of the input signal.

7. The digital demodulator of claim 6, wherein the re-tracker detects the first output signal and compares the first output signal with the threshold values to generate the tuning signal.

8. The digital demodulator of claim 6, wherein further the re-tracker detects the first output signal and compares the average of the first output signal in a predetermined period time with the threshold values to generate the tuning signal.

9. The digital demodulator of claim 1, wherein the oscillator is a numerically controlled oscillator.

10. A digital demodulation method adapted in a digital demodulator to adjust the phase-locked loop bandwidth comprising the steps of:
    generating a complex signal by a phase splitter of the digital demodulator according to an input signal;
    multiplying the complex signal by first and second phase signals by a complex multiplier of the digital demodulator to generate first and second base band signals respectively;
    generating a first output signal by an automatic frequency controller of the digital demodulator according to the first base band signal;
    generating a trend signal by a limiter of the digital demodulator according to the first output signal;
    multiplying the trend signal by the second base band signal by a phase detector of the digital demodulator to generate a multiplied signal;
    generating a tuning signal by the phase detector of the digital demodulator;
    receiving the multiplied signal by an automatic phase controller of the digital demodulator and tuning the phase of the multiplied signal by changing at least one bandwidth parameter of the digital demodulator according to the tuning signal to generate a second output signal;
    generating the first and the second phase signals by an oscillator of the digital demodulator according to the second output signal; and
    multiplying the trend signal by the first and second base band signals by a post-multiplier of the digital demodulator for output.

11. The digital demodulation method of claim 10, before generating a tuning signal, further comprising the steps of:
    computing a plurality of threshold values by a re-tracker of the digital demodulator according to the average of the absolute peak value of the amplitude of the input signal in the present time period;
    comparing the first output signal with the threshold values by the re-tracker of the digital demodulator to generate the tuning signal.

12. The digital demodulation method of claim 11, wherein the threshold values includes a highest threshold value, a medium threshold value and a lowest threshold value, and the at least one bandwidth parameter of the digital demodulator is changed to enlarge the phase-lock loop bandwidth of the digital demodulator if the first output signal is lower than the medium threshold value and narrow the phase-lock loop bandwidth of the digital demodulator if the first output signal is larger than the medium threshold value.

13. The digital demodulation method of claim 11, wherein the threshold values includes a highest threshold value, a medium threshold value and a lowest threshold value, and the digital demodulator is reset when the input signal is not locked in a threshold time period and the first output signal is lower than the lowest threshold value.

14. The digital demodulation method of claim 11, wherein the threshold values includes a highest threshold value, a medium threshold value and a lowest threshold value, and the at least one bandwidth parameter of the digital demodulator is changed to enlarge the phase-lock loop bandwidth of the digital demodulator if the first output signal is smaller than the lowest threshold value and the phase-locked loop bandwidth of the digital demodulator is smaller than a highest bandwidth threshold.

15. The digital demodulation method of claim 11, wherein the threshold values includes a highest threshold value, a medium threshold value and a lowest threshold value, and the at least one bandwidth parameter of the digital demodulator is changed to narrow the phase-lock loop bandwidth of the digital demodulator if the first output signal is larger than the highest threshold value and the phase-locked loop bandwidth of the digital demodulator is larger than a lowest bandwidth threshold.

16. The digital demodulation method of claim 10, before generating a tuning signal, further comprising the steps of:
computing a plurality of threshold values by a re-tracker of the digital demodulator according to the average of he absolute peak value of the amplitude of the input signal in the present time period;
comparing the average of the first output signal in a predetermined time period with the threshold values by the re-tracker of the digital demodulator to generate the tuning signal.

17. The digital demodulation method of claim 16, wherein the threshold values includes a highest threshold value, a medium threshold value and a lowest threshold value, and the at least one bandwidth parameter of the digital demodulator is changed to enlarge the phase-lock loop bandwidth of the digital demodulator if the average of the first output signal is lower than the medium threshold value and narrow the phase-lock loop bandwidth of the digital demodulator if the average of the first output signal is larger than the medium threshold value.

18. The digital demodulation method of claim 16, wherein the threshold values includes a highest threshold value, a medium threshold value and a lowest threshold value, and the digital demodulator is reset when the input signal is not locked in a threshold time period and the average of the first output signal is lower than the lowest threshold value.

19. The digital demodulation method of claim 16, wherein the threshold values includes a highest threshold value, a medium threshold value and a lowest threshold value, and the at least one bandwidth parameter of the digital demodulator is changed to enlarge the phase-lock loop bandwidth of the digital demodulator if the average of the first output signal is smaller than the lowest threshold value and the phase-locked loop bandwidth of the digital demodulator is smaller than a highest bandwidth threshold.

20. The digital demodulation method of claim 16, wherein the threshold values includes a highest threshold value, a medium threshold value and a lowest threshold value, and the at least one bandwidth parameter of the digital demodulator is changed to narrow the phase-lock loop bandwidth of the digital demodulator if the average of the first output signal is larger than the highest threshold value and the phase-locked loop bandwidth of the digital demodulator is larger than a lowest bandwidth threshold.

* * * * *